United States Patent
Hellberg et al.

(10) Patent No.: US 7,881,683 B2
(45) Date of Patent: Feb. 1, 2011

(54) GENERATION OF MODULATED RADIO FREQUENCY SIGNALS

(75) Inventors: Richard Hellberg, Huddinge (SE); Tony Fonden, Spanga (SE)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 863 days.

(21) Appl. No.: 11/722,257

(22) PCT Filed: Dec. 21, 2004

(86) PCT No.: PCT/SE2004/001990

§ 371 (c)(1),
(2), (4) Date: Jun. 20, 2007

(87) PCT Pub. No.: WO2006/068553

PCT Pub. Date: Jun. 29, 2006

(65) Prior Publication Data

US 2008/0146171 A1  Jun. 19, 2008

(51) Int. Cl.
*H04B 1/04* (2006.01)
(52) U.S. Cl. ............... 455/127.1; 455/102; 455/108
(58) Field of Classification Search ............ 455/102, 455/108, 110, 127.1–127.5
See application file for complete search history.

(56) References Cited

U.S. PATENT DOCUMENTS

| | | | |
|---|---|---|---|
| 2,703,865 A * | 3/1955 | Grayson | 455/118 |
| 3,496,453 A * | 2/1970 | Swain | 327/421 |
| 3,821,631 A * | 6/1974 | Betke | 327/246 |
| 4,249,120 A * | 2/1981 | Earle | 455/127.1 |
| 4,344,126 A * | 8/1982 | Schumacher | 363/126 |
| 5,083,312 A * | 1/1992 | Newton et al. | 455/108 |
| 5,717,579 A * | 2/1998 | Sohner | 363/17 |
| 5,811,889 A * | 9/1998 | Massie | 455/102 |
| 6,005,952 A * | 12/1999 | Klippel | 381/71.11 |
| 6,117,082 A * | 9/2000 | Bradley et al. | 455/102 |
| 7,050,254 B1 * | 5/2006 | Yu et al. | 360/55 |
| 2002/0009980 A1 * | 1/2002 | Katakura et al. | 455/127 |
| 2002/0193085 A1 | 12/2002 | Mathe et al. | |

* cited by examiner

Primary Examiner—Lana N Le (57) ABSTRACT

RF signal generators (1) are disclosed, having an amplitude-modulated amplifier (80) whose supply voltage (70) is a signal non-linearly filtered (33) dependent on a signal (30) being representative to an envelope signal of a desired output RF signal (81). The non-linear filtering (33) is performed preferably using an envelope-dependent boundary. An input RF signal (65) to the amplifier (80) is amplified using the supply voltage (70) to produce the desired output RF signal (81). The present invention also presents methods for driving such generators (1).

32 Claims, 8 Drawing Sheets

Fig. 1A

PRIOR ART

PRIOR ART

GENERATION OF MODULATED RADIO FREQUENCY SIGNALS

TECHNICAL FIELD

The present invention relates in general to generation of modulated radio frequency signals and in particular to such systems and methods using a power amplifier having a supply voltage being dependent on an envelope signal.

BACKGROUND

An Envelope Elimination and Restoration (EER) Radio Frequency (RF) Power Amplifier (PA) separates the amplitude modulation part, i.e. the envelope, of the RF signal and the phase-modulated constant-amplitude carrier of the RF signal. The envelope signal is amplified and used as the supply voltage to an RF amplifier, whereby the amplitude modulation part being imposed upon the phase-modulated constant-amplitude carrier. In a strict definition of EER lies that the input signal to the final RF amplifier, i.e. the phase-modulated constant-amplitude carrier, has no amplitude modulation. The amplitude variations in the output are therefore produced solely by the modulated supply voltage.

With practical power transistors, i.e. having moderate gain, the amplitude modulation is preferably substantially retained in the input to the RF power amplifier for the sake of efficiency. When the envelope influences the supply voltage to a lesser degree than 100%, the system is called dynamic drain (collector, plate) biasing. Other names for EER and dynamic drain biasing systems are collector (plate, drain) modulation and high-level modulation.

An EER RF PA is theoretically very efficient, since it separates the amplitude modulation part of the RF signal and amplifies this in an efficient, usually switched-mode, class S, base-band amplifier. The amplified envelope is used as the supply voltage to an RF amplifier, whose losses are reduced since the average voltage drop over it is reduced compared to amplifiers with constant supply voltage, always at maximum.

However, the separation of an RF signal, E(t)cos(w(t)) into envelope, E(t), and phase (carrier), cos(w(t)), is a non-linear operation that increases the bandwidth. Both these signals are generally much more wide-band than the incoming RF signal.

The efficiency of an envelope amplifier that has to correctly amplify a signal with large bandwidth is generally low. A narrower bandwidth envelope signal can be amplified with higher efficiency. The problem is that the separated envelope signal typically needs to be represented with a substantially larger bandwidth than the RF input signal to get sufficient output quality.

One solution to this is to let the envelope signal being band-limited by a linear low-pass filter, see e.g. [1]. Such band-limited envelope signal will, however, exhibit overshoots and undershoots compared to the unfiltered version. The occurrence of undershoots and overshoots will generally decrease efficiency and/or signal quality.

Another solution to the envelope amplifier bandwidth-handling problem is to increase the envelope signal for low signal amplitudes, see e.g. [2]. A smooth curve is used, representing the relation between envelope signal and used supply voltage. The curve starts at some fraction of the maximum level and approaches the pure envelope curve at high signal amplitudes. The drawback of this is that the efficiency is much reduced if a significant bandwidth reduction is to be achieved.

SUMMARY

A general problem with prior art solutions is that efficiency in generating RF signals is not high enough in certain situations.

A general object of the present invention is thus to provide methods and systems for generating RF signals, having improved efficiency.

The above object of the present invention is achieved by methods and devices according to the enclosed claims. In general, the present invention presents RF signal generators having an amplitude-modulated amplifier whose supply voltage is a signal non-linearly filtered dependent on a signal being representative to an envelope signal of a desired output RF signal. The non-linear filtering preferably uses an envelope-dependent boundary. An input RF signal to the amplifier is amplified using the supply voltage to produce the desired output RF signal. The present invention also presents methods for driving such generators.

A particular embodiment of the present invention makes use of an EER-like scheme, in which a supply voltage, $V_{dd}$, for amplification of a carrier signal is kept out of regions of inefficiency and low output quality, while restricting its bandwidth to increase efficiency of the envelope amplifier. The bandwidth restriction comes from a non-linear filter that also gives a $V_{dd}$ signal that has no or at least little undershoot below a minimum boundary. The $V_{dd}$ signal can also be made to stay closer to an optimum level that is generally a function of the envelope.

The input RF signal to the amplifier comprises in a preferred embodiment phase information corresponding to the desired RF output signal and is preferably provided by modifying an input information signal, representing a non-amplified version of the desired RF output signal. The modification preferably makes use of information about the characteristics of the amplifier and supply voltage.

The present invention has higher efficiency and output signal quality for a given bandwidth. Analogously, the bandwidth resulting when applying the present invention is much lower, for corresponding efficiency and quality. Furthermore, the signal processing involved is straightforward, when reading the following description.

BRIEF DESCRIPTION OF THE DRAWINGS

The invention, together with further objects and advantages thereof, may best be understood by making reference to the following description taken together with the accompanying drawings, in which.

DETAILED DESCRIPTION

In order to understand the present invention better, the description starts with a somewhat deeper discussion and retrospective analysis of prior art systems.

Figure 1A:
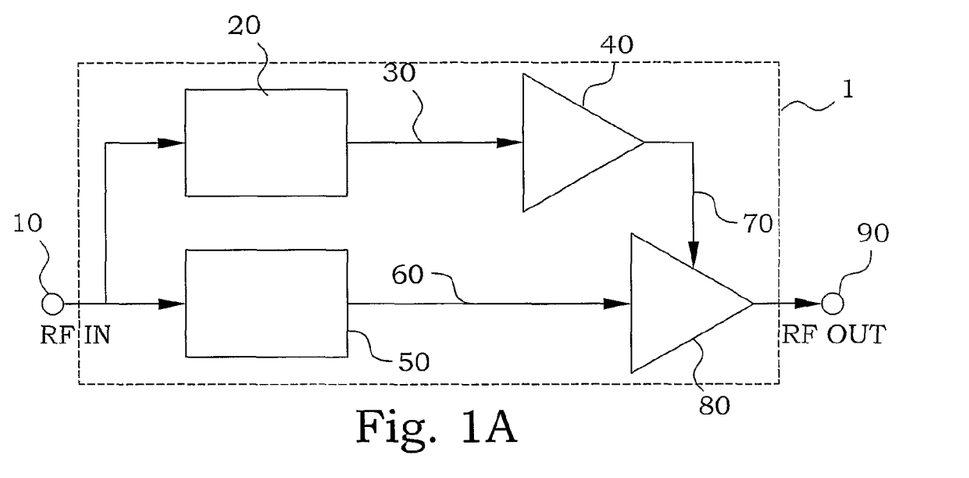
FIG. 1A is a block scheme of an embodiment of a general envelope elimination and restoration amplifier.

In FIG. 1A, a basic version of a traditional EER amplifier 1 is illustrated. An input 10 receives an input RF signal. A desired output signal is a linear amplification of this input RF signal. An envelope signal 30 of the input signal is detected by an envelope detector 20, and a limiter 50 provides a phase-modulated carrier signal 60 corresponding to the input RF signal that ideally is constant in amplitude. The envelope signal 30 is amplified in an envelope amplifier 40 giving a signal 70 used as a supply voltage at an amplifier 80 for the phase-modulated carrier signal 60. The amplifier 80 produces an output RF signal on an output 90 that ideally is an amplified version of the input RF signal as desired.

Figure 1B:
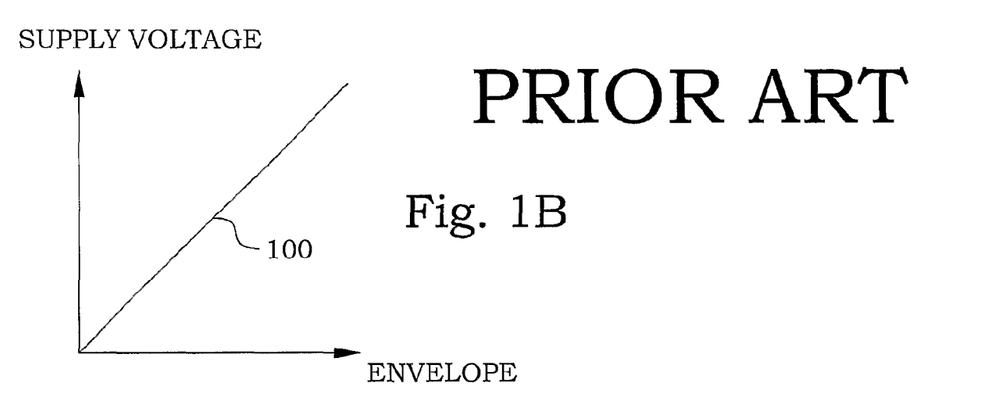
FIG. 1B is a diagram illustrating the relation between envelope and supply voltage for the embodiment of FIG. 1A.

Ideally, the used supply voltage is a linear function of the input signal envelope, as illustrated by the curve 100 in FIG. 1B. However, as mentioned in the background section, the envelope signal 30 is typically a signal presenting a relatively wide bandwidth, whereby the envelope amplifier 40 operates at relatively low efficiencies. More than 7 times wider bandwidth is required for a carrier to intermodulation ratio of more than 30 dB. Also the remaining phase-modulated carrier signal 60 often has a larger bandwidth than the original input signal.

Figure 1C:
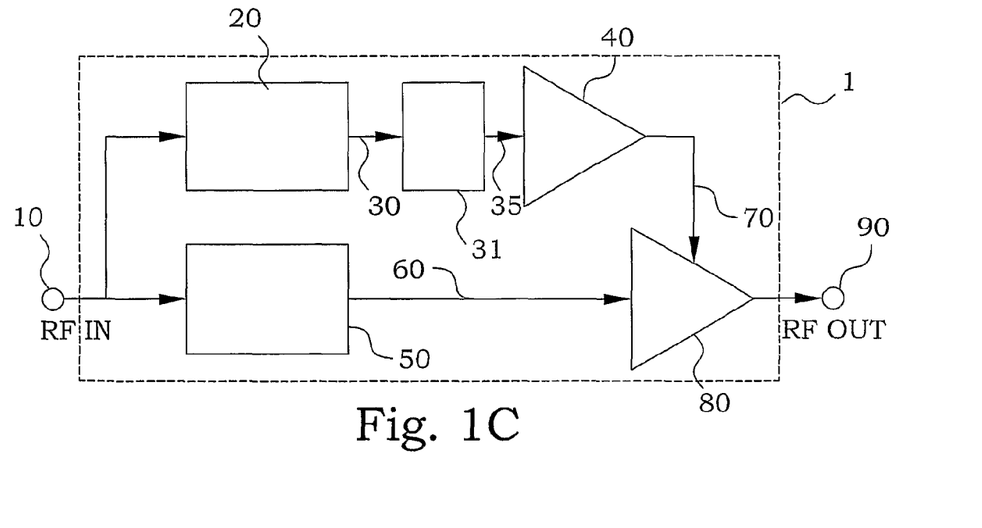
FIG. 1C is a block scheme of an embodiment of an envelope elimination and restoration amplifier using band-pass filtering.

FIG. 1C illustrates a prior art solution, where a low-pass filter 31 is introduced after the envelope detector 20, modifying the envelope signal 30 into a bandwidth restricted envelope signal 35. This restricted envelope signal 35 is used as input signal to the envelope amplifier 40, which now allows for a more efficient amplification. However, the low-pass filtering introduces overshoots and undershoots.

Overshoots generally decrease efficiency proportionally, since they represent unnecessary supply voltage that is dissipated in the power amplifier 80. Overshoots also increase gain, since the amplifier 80 goes less into saturation. If this effect is not compensated for, the signal quality suffers drastically.

Undershoot in the band-limited envelope signal 35 instead causes the RF output of the amplifier 80 to drop below the desired amplitude level. This in turn means that a safety margin corresponding to the size of the maximum expected undershoot must be added to the supply voltage to make it possible to get a linear output. This decreases efficiency in the same way that overshoots do.

Figure 1D:
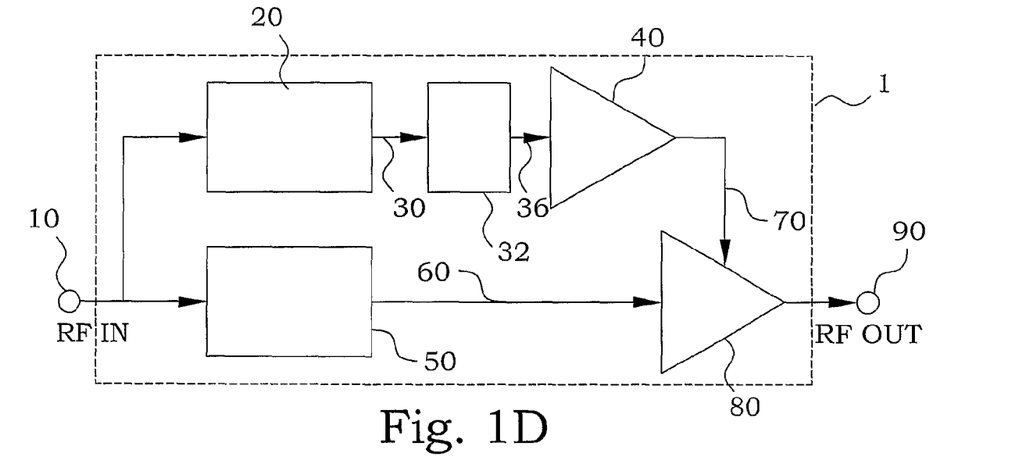
FIG. 1D is a block scheme of an embodiment of an envelope elimination and restoration amplifier using a non-linear relation between envelope and supply voltage.

By instead using a non-linear relation between the envelope signal and the supply voltage, at least at low envelope signals, the bandwidth of the supply voltage can be reduced. FIG. 1D illustrates such an arrangement, where a non-linear processing unit 32 is introduced after the envelope detector 20 in order to give a modified envelope signal 36 that is a static non-linear function of the detected envelope signal 30. In other words, there is a direct correspondence between the momentary value of the detected envelope signal 30 and the momentary value of the modified envelope signal 36. The limiter 50 has to be modified accordingly into a modulator, allowing the phase-modulated carrier signal 60 to have changing amplitude, also directly dependent on the momentary value of the detected envelope signal 30.

Figures 1E, 1F:
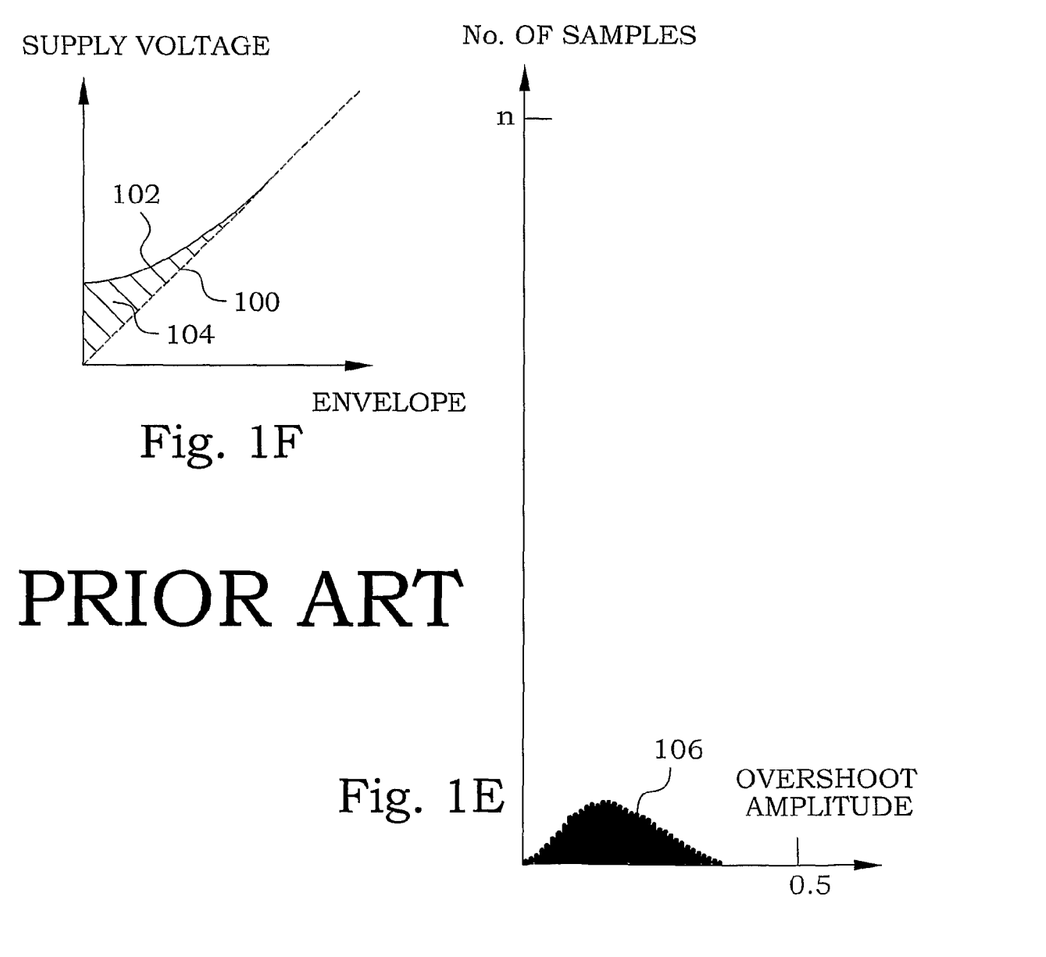
FIG. 1E is a diagram illustrating overshoot distribution as caused by an amplifier according to FIG. 1D.
FIG. 1F is a diagram illustrating the relation between envelope and supply voltage for the embodiment of FIG. 1D.

An example of a relation between envelope and supply voltage is illustrated in FIG. 1F as a curve 102. However, since the supply voltage in many cases is higher than the minimum, represented by the linear relation 100, the efficiency of the amplification is reduced. An area 104 visualises the excess dissipated power of such a set-up.

For example, a reduction of the bandwidth to strictly that of the input RF signal requires an envelope that is a squared function of the input signal envelope starting at half the maximum level. The static relationship between envelope signal (supply voltage) overshoot and input signal amplitude in this solution makes it easy to compensate for the gain increase in the modulator 50.

A distribution of overshoot amplitudes 106 from an EER system a non-linear relation between envelope and supply voltage is illustrated in FIG. 1E.

In retrospect, knowing the results of the present invention, it can be seen some prior art restricts the bandwidth of the supply voltage, giving low output quality or low efficiency. Other prior art uses a supply voltage that often is situated in regions of inefficiency. The improvement can be seen as a system dynamically finding an appropriate compromise between these two extremes.

In a general view, the present invention presents a generation of modulated RF signals that is based on amplification of an input RF signal using a supply voltage non-linearly filtered depending on an envelope of a desired RF output.

Figure 2A:
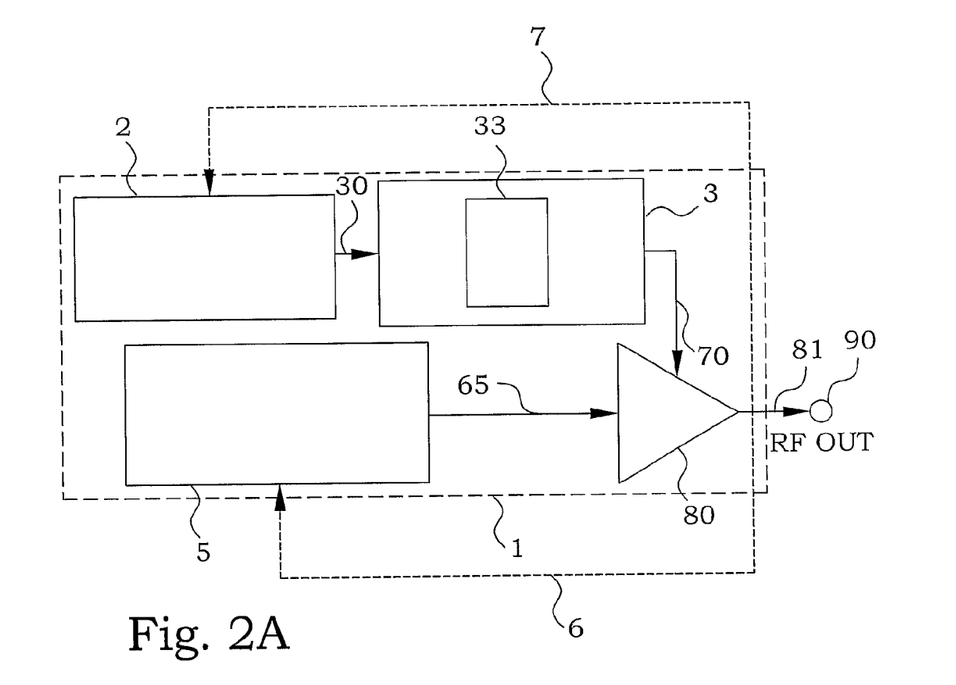
FIG. 2A is a block scheme of an embodiment of an amplifier according to the present invention.

FIG. 2A illustrates an embodiment of a general generator 1 for modulated RF signals according to the present invention. The generator 1 is arranged around an RF PA 80, the output signal 81 of which being the desired output RF signal provided at an output 90 of the generator 1. Generating means 5 of an input RF signal 65 is connected to the RF input of the PA 80.

In the general embodiment of FIG. 2A, the arrangement is a general RF signal generator. The information about the desired output RF signal may be provided in different forms and from different sources. The information may e.g. be provided as digital data describing the output or as signals carrying corresponding information. However, in many practical applications, the arrangement operates as an amplifier, having an original modulated signal input to the arrangement, which is intended to be amplified, preferably linearly, to generate the desired output RF signal.

The generating means 5 is provided with signals, data or other information 6 about the desired output RF signal, represented by a dashed arrow. As discussed above, this dashed arrow 6 just indicates a logical association, not a physical connection.

The generator 1 further comprises means 2 for providing a signal 30 representing an envelope signal of the desired output RF signal. The means 2 is provided with signals, data or other information 7 about the desired output RF signal, represented by a broken arrow. As discussed above, this dashed arrow 7 just indicates a logical association, not a physical connection. The signal 30 is provided by a connection to a supply voltage generator 3, which by use of a non-linear filter 33 generates a supply voltage 70. The supply voltage 70 is connected to a supply voltage input of the PA 80. The operation of the non-linear filter 33 is dependent on the signal 30. In the present embodiment, the non-linear filter 33 operates with a boundary that is dependent on the signal 30. The use of the non-linear filter 33 has the effect to introduce a time-dependence in the processing of the supply voltage.

The input RF signal 65 is amplified by the PA 80 using the supply voltage 70 and gives thereby the desired output RF signal 81. The operation of the non-linear filter 33 determines the characteristics of the generator 1. The non-linear filter 33 may e.g. include upper and/or lower limits for the voltage supply. It may also include different bandwidth-restricting means.

The supply voltage 70 is also commonly denoted as drain bias. The generator of FIG. 2A is thus an example of a dynamic drain bias generator.

Figure 2B:
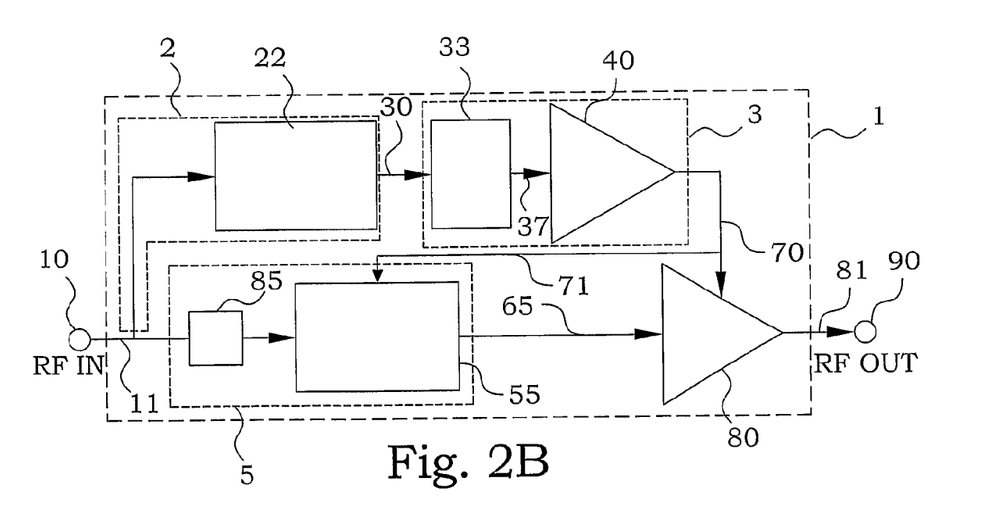
FIG. 2B is a block scheme of another embodiment of an amplifier according to the present invention.

FIG. 2B illustrates an embodiment in the shape of an amplifier 1 according to the present invention. An input 10 receives an original modulated signal 11. The means 2 for providing a signal 30 representing an envelope signal comprises in this embodiment an envelope detector 22 and connections for the original modulated signal 11. An envelope 30 of the original modulated signal 11 is thus detected, which is a good representation of the envelope of the desired output RF signal. The envelope 30 is provided to the supply voltage generator 3, which comprises a non-linear filter 33 connected to receive the signal 30 representing the envelope signal. The non-linear filter 33 uses in the present embodiment an envelope-dependent boundary to produce a modified envelope signal 37 as an output signal of the non-linear filter 33. The modified envelope signal 37 is preferably limited in bandwidth. In this embodiment, the signal 37 is amplified in an envelope amplifier 40, which now may operate with a narrow bandwidth, giving a supply voltage 70. The supply voltage is provided to the power amplifier 80.

The generating means 5 of an input RF signal 65 comprises in this embodiment a dynamic modulator 55, a delay means 85 and connections to the original modulated signal 11. Since the supply voltage 70 is not always representing the exact envelope of the original modulated signal 11, a pure amplitude-constant phase-modulated carrier signal of the original modulated signal 11 may not give the desired output RF signal. Typically, a phase-modulated carrier signal corresponding to the original modulated signal 11 has to be modified in amplitude. The modifications are made as dynamic adjustments in order to compensate for the non-linearities introduced by the non-linear filter 33, and result in a modified phase-modulated carrier signal as input RF signal 65. The dynamic modulator 55 has to know about the result of the supply voltage generator 3 output. One solution is that the dynamic modulator 55 has means for estimating the processes in the non-linear filter 33. In the present embodiment, however, the supply voltage 70 (or any representation thereof) is connected 71 to the dynamic modulator 55 for providing updated information about the (indirect) result of the non-linear filter 33. In this embodiment, the dynamic modulator 55 thereby also automatically compensates for non-linearities introduced by the envelope amplifier 40. The dynamic modulator 55 may provide the modified phase-modulated carrier signal 65 directly from the original modulated signal 11 or may first create a true constant amplitude phase-modulated carrier signal, which then is dynamically adjusted.

Since the non-linear/filter processing usually delays the $V_{dd}$ signal compared to the input signal that caused it, a compensating delay may be needed for the signal to the RF amplifier 80, so that the $V_{dd}$ voltage 70 and RF input voltage 65 to the power transistor(s) are synchronous. A delay unit 85 is therefore placed between the input 10 and the dynamic modulator 55 in the present embodiment. In alternative embodiments, delay units may be incorporated in other places, in order to synchronise the two branches of the amplifier 1.

An amplifier 80 amplifies the modified phase-modulated carrier signal 65 using the amplified supply voltage 70 and produces thereby an output RF signal 81 at an output 90 that is an amplified version of the original modulated signal 11.

Figure 2C:
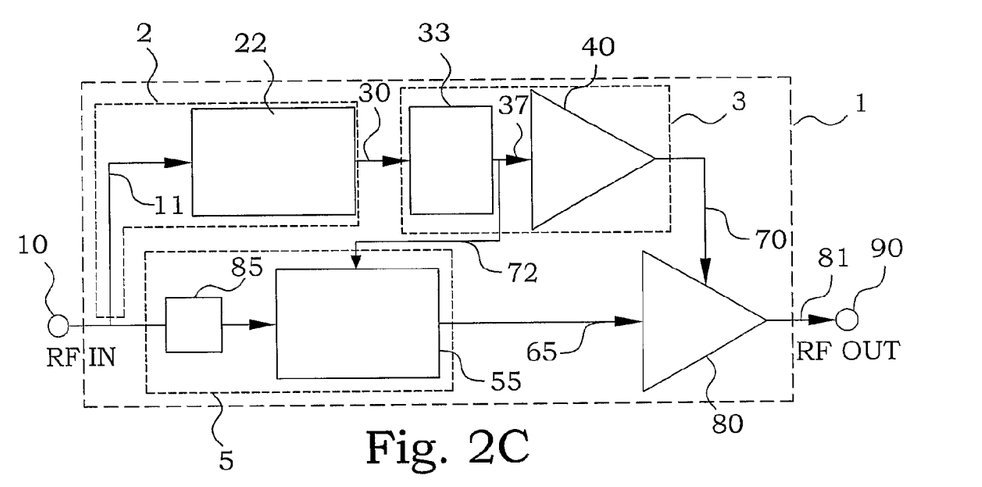
FIG. 2C is a block scheme of yet another embodiment of an amplifier according to the present invention.

In FIG. 2C another embodiment of an amplifier 1 according to the present invention is illustrated. In this embodiment, a connection 72 between the output of the non-linear filter 33 and the dynamic modulator 55 is present, for providing the dynamic modulator 55 with information about the outcome of the filtering, i.e. a representation of the modified envelope signal 37. In this embodiment, the dynamic modulator 55 further comprises functionalities that compensate for the amplification characteristics of the envelope amplifier 40. The need for emulating the behaviour of the envelope amplifier 40 increases the complexity of the dynamic modulator 55. However, in a digital implementation of the dynamic modulator 55, the signal 70 has not to be digitised, which saves the cost for an A/D converter.

In alternative embodiments, the dynamic modulator 55 may operate using a feed-back mechanism with regard to the PA 80. Compensation for non-linearities of the envelope amplifier 40 may also be introduced as either pre-distortion of the modified envelope signal 37, or feedback around the envelope amplifier 40.

If one assumes that $V_{opt}$ is the momentary supply voltage to the RF PA 80 that gives the highest efficiency for a specific output 81 amplitude, $V_{opt}$ is in simple models and sometimes in practice taken as proportional to the envelope E(t) 30 of the original modulated signal, $V_{in}$, 11 and therefore also proportional to the envelope E(t) of the desired output RF signal 81. However, in a generalised view, $V_{opt}$ can be a function of the envelope of the original modulated signal 11 or desired output RF signal 81.

Efficiency, at least to a first approximation, increases with decreasing $V_{dd}$, 70. However, if one takes into account the large input signal 65 needed to compensate for the low gain of saturated PA transistors, caused by low $V_{dd}$, one finds that some extra voltage added to the absolute minimum for each output level gives the best overall efficiency, $V_{opt}$. The "soft", practical, lower limit is therefore usually somewhere between the "hard" lower limit, defined by too low output signal quality, and $V_{opt}$. The lower limit used in the processing is called $V_{min}$.

A maximum limit, $V_{max}$, can also be used in the processing.

As previously stated, the problem is that $V_{opt}$ generally has a much larger bandwidth than $V_{in}$ 11, and if it is linearly filtered it exhibits undershoots that reduce output quality and decrease efficiency. In order to be able to use an inexpensive and efficient envelope amplifier, the invention therefore ideally should form a $V_{dd}$ signal 70 that optimises the efficiency of the RF PA 80 under the condition of limited bandwidth.

Furthermore, a subsidiary condition is that the quality of the final RF output is high enough, i.e. that the PA 1 meets linearity specifications.

The output signal 81 depends on both the $V_{dd}$ signal 70 and the RF PA's input signal 65.

Reducing the input signal 65 to the final amplifier 80 can compensate for increased gain due to $V_{dd}$ 70 overshoots. Linearisation methods such as feedback and pre-distortion can achieve this compensation. Pre-distortion is in this case only moderately harder than for an amplifier with constant supply voltage. The effect is predictable because the filter and input envelope signal are both known and the power amplifier behaviour 80 can be measured by comparing the output to the known inputs. The power amplifier behaviour 80 can thus be compensated for.

All input linearisation methods face the fundamental difficulty that the requested $V_{out}$ 81 can only be obtained at all when $V_{dd}$ 70 is inside a limited interval. Below the lower limit of this interval, the driver amplifier, or feedback arrangement, cannot provide a large enough input signal to provide the correct output. The upper limit may be determined by physical limitations such as voltage breakdown in the transistors of the RF PA 80. Both these limits depend on the envelope signal amplitudes and are therefore functions of the envelope 30.

A method to achieve a close to optimal $V_{dd}$ signal 70 that avoids regions of inefficiency and low output quality is to use a cascade of stages or phases. In each stage, one takes the difference between the minimum envelope signal, $V_{min}$, and the band-limited envelope signal from a previous stage, passes the positive parts of this difference signal through a filter that restricts its bandwidth, and adds it to the band-limited envelope signal from the previous stage. In this way, the band-limited envelope signal is built up stage-by-stage from generally smaller and smaller contributions.

Figure 3:
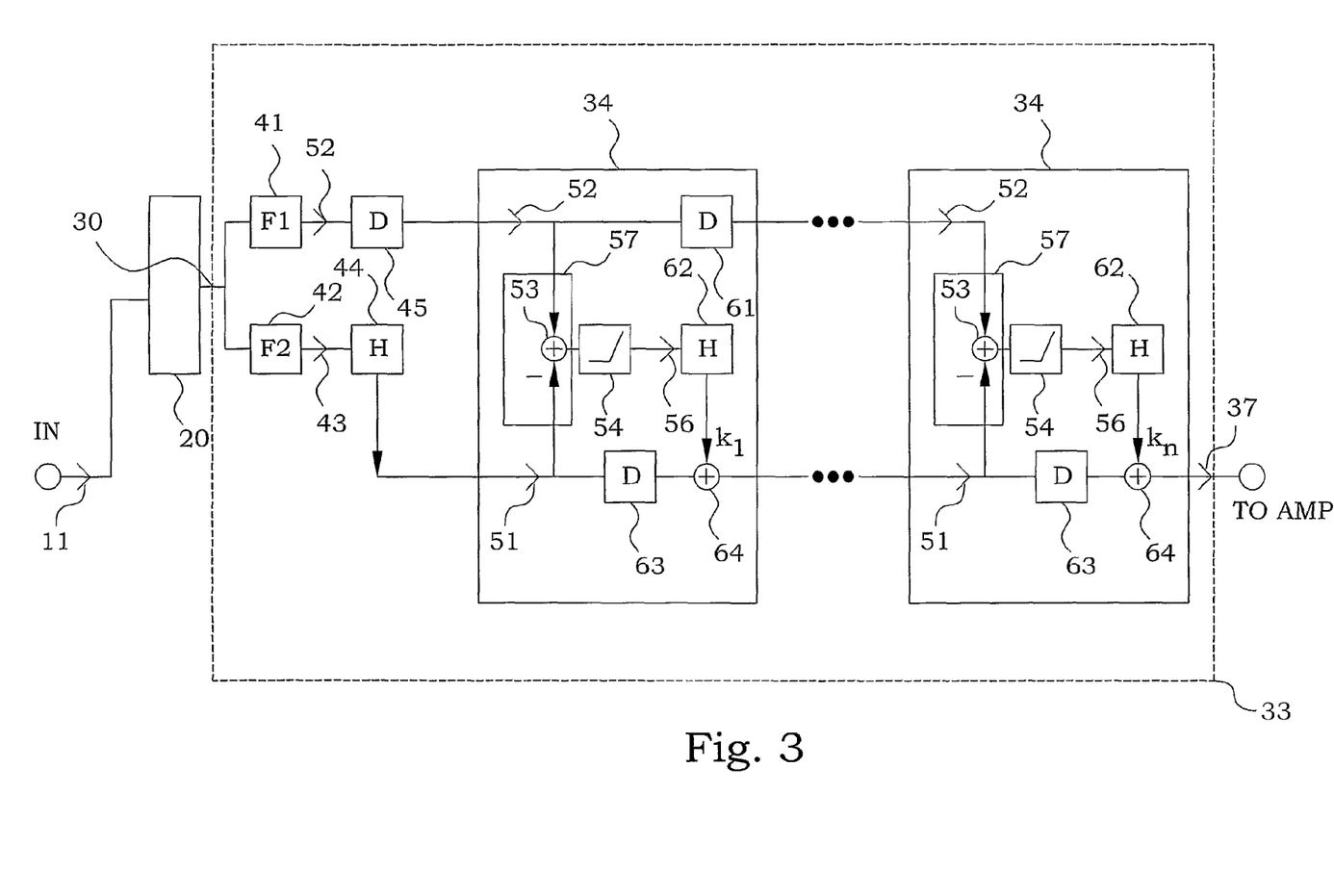
FIG. 3 is a block scheme of an embodiment of a non-linear filter means usable in an amplifier arrangement according to the present invention.

FIG. 3 illustrates a particular embodiment of a non-linear filter 33 for use in an arrangement according to the present invention. This non-linear filter 33 is based on the multi-stage approach described above. The envelope signal 30 is connected to a processing unit 41, which generates a reference signal 52. This reference signal 52 is the ideal signal if there would be no bandwidths concerns, i.e. $V_{min}$. In an EER-like amplifier, this reference signal is as described above typically equal to or close to a linear function of the envelope. However, in a general case, the reference signal 52 can be any function F1 of the envelope signal 30.

The envelope signal 30 is also provided to another processing unit 42, which generates a seed signal 43 for the process of obtaining the modified envelope signal 37. The processing unit 42 in the present embodiment gives a seed signal that is a function F2 of the envelope signal 30. In an extreme case, this function could even be set to zero. In order to restrict the bandwidth within allowed ranges, the seed signal is connected to a low-pass filter 44, giving a seed signal of appropriate bandwidth as input to a first actual stage of the non-linear filter means 33.

Since the processing in the filter 44 and may be also in the processing units 41, 42 are associated with certain time delays, the reference signal 52 is delayed in a delay unit 45 in a corresponding manner in order to synchronise the reference signal and the seed signal at the input to the first stage.

The non-linear filter means 33 of FIG. 3 further comprises a number of non-linear signal processing stages 34. In this embodiment, the stages are essentially identical, except for an optional reinsertion factor further described below. The reference signal 52 and the seed signal 51 are provided to a means 57 for providing an insertion signal 56. A subtractor 53 is connected to the reference signal 52 and the seed signal 51, providing the difference there between. The subtractor 53 can e.g. be implemented as in FIG. 3 as an adder of a negative seed signal 51. The difference is subsequently rectified in a rectifier 54, extracting the positive parts of the difference signals, to produce the insertion signal 56. This insertion signal 56 represents the ideal addition to the seed signal that would give an output signal having no undershoots at all. However, the raw insertion signal 56 does not comply with bandwidth constraints. Therefore, the insertion signal 56 is connected to a filter 62, reducing the bandwidth into the allowed range. The filter 62 is typically a low-pass filter. The filters in the different stages are typically similar but not necessarily exactly identical. The bandwidth-reduced insertion signal is then combined with the input signal 51 to the stage 34, delayed by a delay means 63, in order to compensate for any delays in the subtractor 53, the rectifier 54, and/or the filter 62. In this embodiment, the bandwidth reduced insertion signal is added to the stage input signal 51 using a certain reinsertion factor, which will be discussed more in detail further below. The output signal from this first stage is connected as the input signal 51 to the next stage in the cascade of stages, as indicated by the dots in FIG. 3. Also the reference signal 52 is connected to the next stage, delayed by a delay means 61 in order to be in phase with the input signal 51.

The reinsertion factors, $k_1$ to $k_n$, can be set to one, given that the rectifiers and filters have unity gain. However, in a general method for improving iterated non-linearity/filter algorithms they can be allowed to increase for each stage, with the first one preferably set to one. With the reinsertion factors properly selected, this leads to a substantial reduction in the number of stages needed for a given level of quality or efficiency. Generally, more stages give better quality, since the band-limited envelope signal then stays better out of regions of inefficiency and low output quality and thus requires less safety margin.

In some cases, $V_{min}$ itself can be used as the seed signal, i.e. the functions F1 and F2 are identical. This is often a good enough approximation when there is only a small difference between the optimal $V_{dd}$ signal (without bandwidth restrictions), $V_{opt}$, and the lower limit of acceptable performance, $V_{min}$. It the distance between $V_{opt}$ and $V_{min}$ is large, $V_{opt}$ can be used as a near-optimal seed signal.

A maximum limit, $V_{max}$, can be used to stay away from breakdown, or to impose efficiency constraints. It is used in the same way as $V_{min}$, and can be processed in a similar way (by extracting overshoots instead of undershoots and subtract the insertion signal).

Optimisation may be needed in practice to find the relationships between seed signal and limits. Soft limits (using soft "rectifiers" with a finite transition region), different limits (e.g. changing $V_{min}$) in different stages, and other modifications may be used to get good performance under various circumstances. Not every stage may in practice need a filter. Especially the last stage may omit the filter if the spectral emissions coming from that stage are low enough.

A system according to the embodiment shown in FIG. 3 is easy to adjust for different applications. Compensation for gain variations due to the $V_{dd}$ signal is as mentioned before performed in the dynamic compensator block 55, which modifies or pre-distorts the RF amplifier's input signal using the additional $V_{dd}$ signal knowledge. The RF PA behaviour as function of supply voltage is stored, preferably in some way that can be updated according to measurements of the output signal. If some types of linearisation, for example feedback, are used, the dynamic modulator 55 may be left out.

An alternative solution to compensate for the envelope amplifier's 40 behaviour is by further modifying, e.g. inverse filtering or pre-distorting, the modified envelope signal 37 provided to the envelope amplifier 40.

Figure 7:
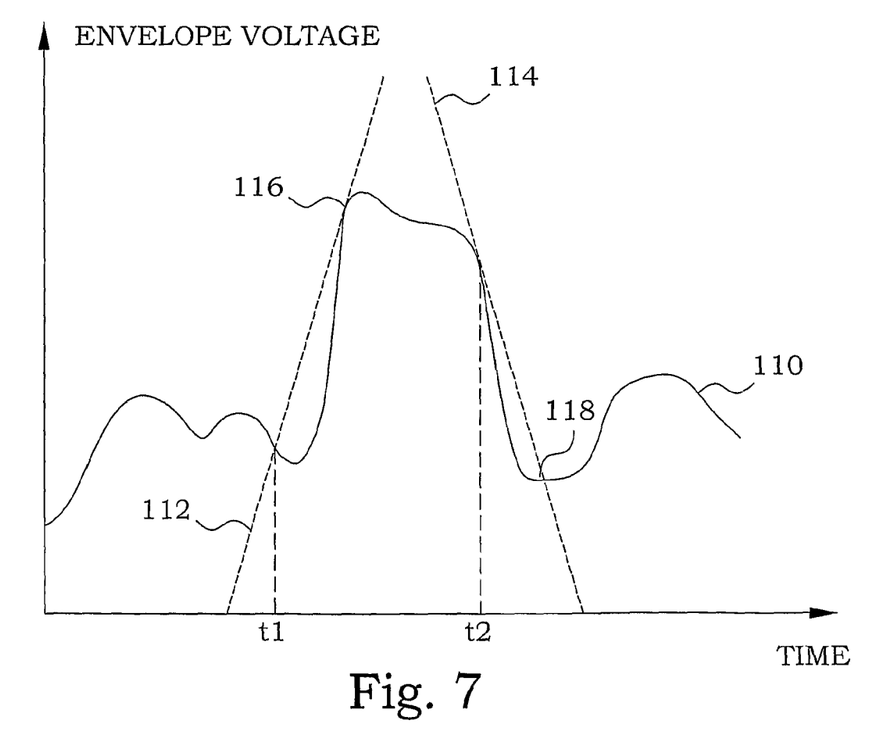
FIG. 7 is a diagram illustrating slew-rate compensation.

In one embodiment, the non-linear filter means 33 may involve compensations for slew-rate limitations in the envelope amplifier 40, i.e. limitations of the voltage rise or drop per time unit. This compensation can be implemented in a non-linear filter using the envelope signal. The envelope signal is analysed in a time interval from the point the output signal is to be produced and a certain future time. The causality is arranged by delays, as in other filters. If the envelope difference at any time during the interval exceeds the time offset times the maximum voltage change rate, the signal has to be compensated. In FIG. 7, a schematic diagram is illustrated, where an input envelope signal is represented by a curve 110. A dashed line 112 represents the fastest voltage increase that is achievable, and a dashed line 114 represents the fastest voltage drop that is achievable. At a time t1, it is found that the envelope signal between time t1 and a point 116 of the envelope curve exhibits a voltage increase that exceeds the maximum rise. In order to reach the point 116, the voltage has to be increased along the line 112 instead. Similarly, at time t2, it is seen that the envelope curve falls too rapidly, and the modified envelope signal has to follow the line 114 instead. The modified envelope signal is thus always larger than or equal to the input envelope signal.

Anyone skilled in the art realises that there are several different modifications on such filters, e.g. where the timing of the signal modifications is designed in different ways.

The present invention can be implemented in a number of different ways. A few non-restrictive examples are given here below. The input signal can be at the final RF. It can also be at an intermediate frequency or it can be at complex baseband frequencies. For analogue inputs, the rectifiers may be diode or transistor circuits and the filters and delays made from capacitors and inductors or by piezo-coupled surface-wave processing. The input can also be digital, or digitised from an analogue input by an analogue-to-digital converter. The signal processing is then performed digitally, and the analogue output provided by a digital-to-analogue converter.

As one skilled in the art will know, all implementations need additional standard analogue, digital, and/or radio components not shown in the simplified figures.

Figure 4:
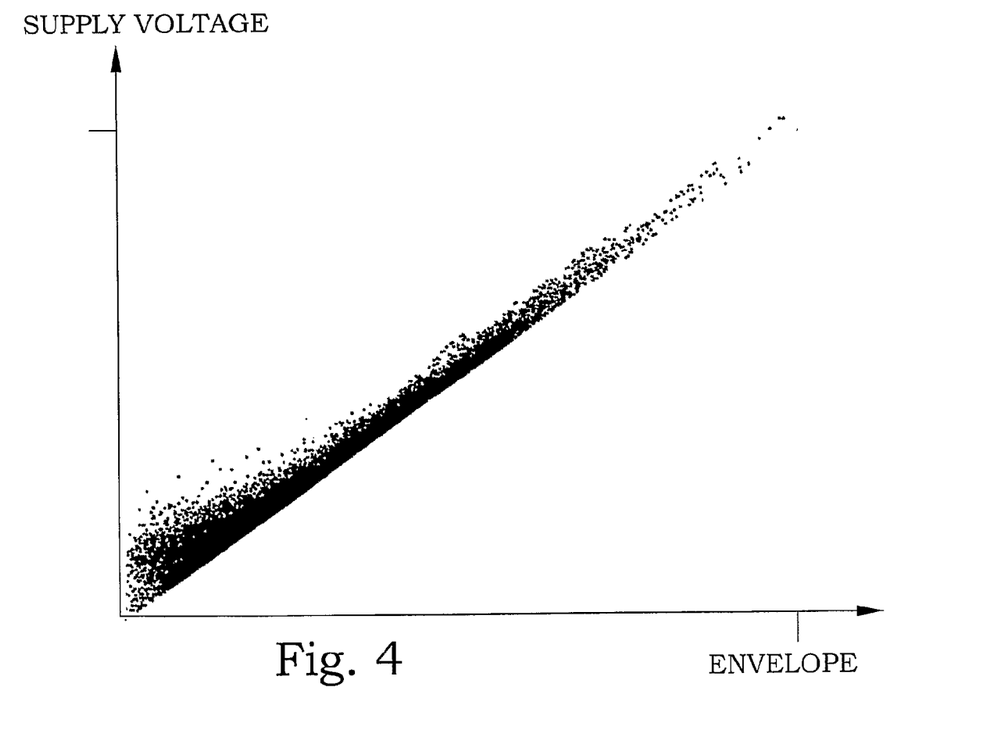
FIG. 4 is a diagram illustrating used supply voltages plotted as a function of the original envelope signal, as achieved by the present invention.

A simulation was made for bandwidths equal to that of the input RF signal as measured at the −30 dB level, compared to the maximum spectral level of the signals except DC components, and 10 dB peak-to-average, Rayleigh-like amplitude statistics in the input signal. The supply voltage signal according to a late-stage output of FIG. 3 versus original modulated signal amplitude is shown in FIG. 4. Here it can be seen that the majority of samples will occur on or very close to the optimum supply voltage, thereby giving a high efficiency.

Figure 5:
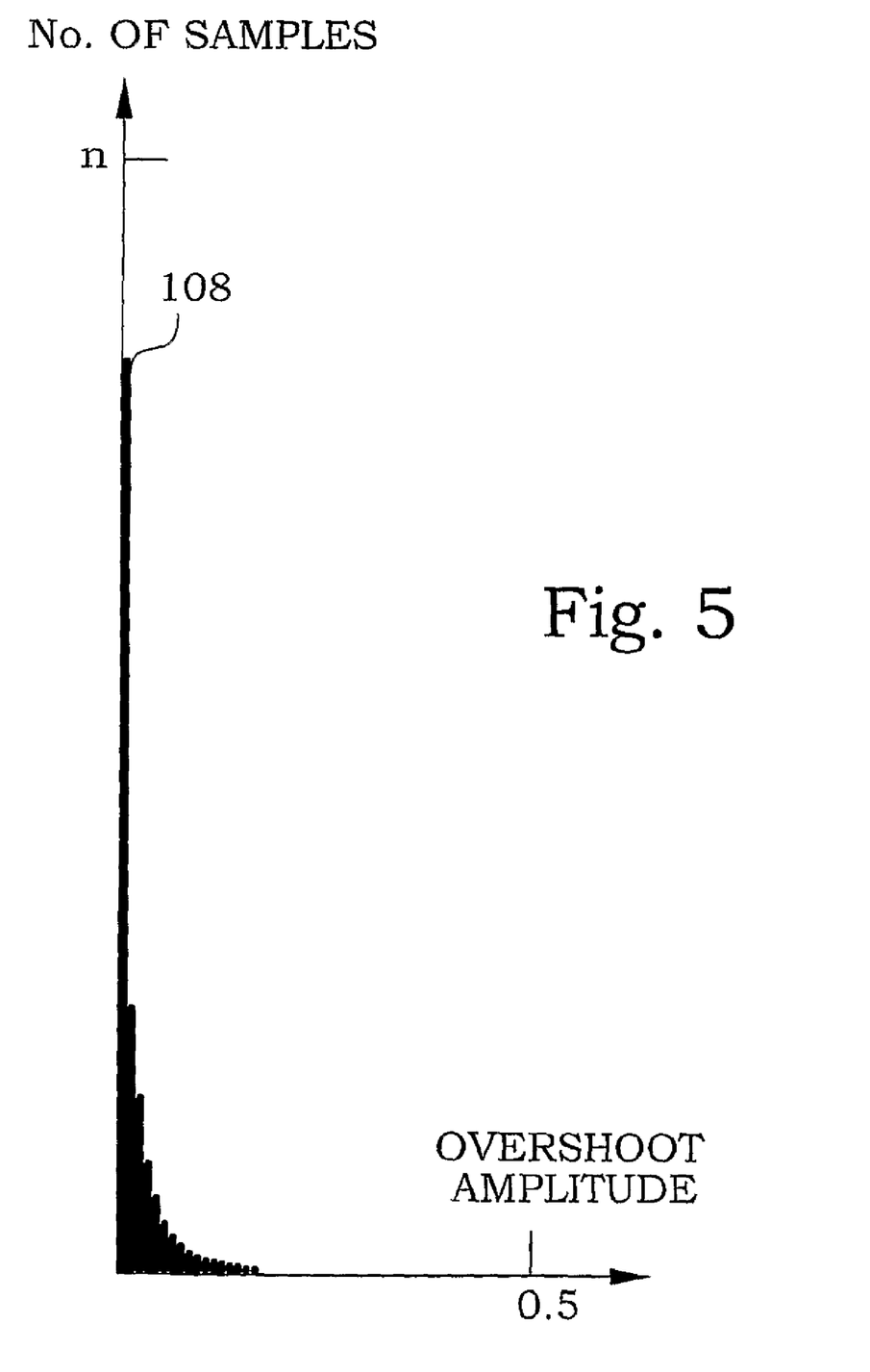
FIG. 5 is a diagram illustrating overshoot distribution as caused by an amplifier according to the present invention.

In this simulation, the principles according to the present invention achieve more than 95% theoretical efficiency. This can be compared with the method in [2], which has an efficiency less than 75% with its parameter b set to 0.4. The reason for this difference is easily understood by comparing FIG. 1E and FIG. 5. Note that the axes are drawn using the same scale. The histograms show the overshoot compared to the ideal curve, i.e. raw amplitude. The invention, FIG. 5, has the major part of its envelope signal at very low overshoot. The tail quickly vanishes towards higher levels. The prior art method [2], FIG. 1E, however, has most of its envelope signal at much higher overshoot levels. The loss is proportional to the product of overshoot and output signal envelope.

The invention thus performs better than prior art solutions. Efficiency and output signal quality are much higher, for the same bandwidth. Analogously, the bandwidth is much lower, for the same efficiency and quality. The signal processing involved is straightforward.

Figure 6:
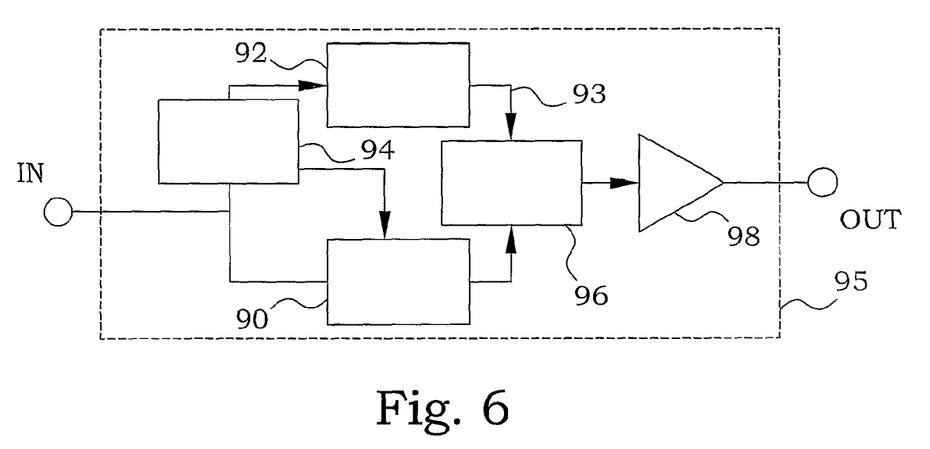
FIG. 6 is a block scheme of an embodiment of a Dynamic Gate Bias system according to the present invention.

Dynamic Gate Bias systems are other applications for the ideas of the present invention. FIG. 6 illustrates one embodiment of a Dynamic Gate Bias system 95. An input signal provided to the system 95 is intended to be amplified and provided as a radio frequency output signal. The input signal is connected to an input detector 94, which is arranged to determine an instantaneous (envelope) size measure of the input signal. An output of the input detector 94 is connected to a bias signal generator 92, which generates a bias signal 93 to be used for providing the actual amplification operation. The bias signal generator 92 can thus provide a bias signal dependent on the input signal. The bias signal generator typically also comprises a bias amplifier. A signal dependent on the input signal is provided as a drive signal. The drive signal and the bias signal are matched in a matching unit 96 and provided to an amplifier 98, e.g. a power transistor, performing the actual amplification according to the selected drive signal and bias signal. A pre-distortion unit 90 is connected to the input signal and an output of the input detector for enabling a suitable pre-distortion of the input signal, typically for providing a linear output signal. An output signal is thus provided. By selecting the pre-distortion and the bias in an appropriate manner dependent on the size of the input signal, an efficient amplification can be achieved.

At low output levels, the gate bias should in many cases preferably be above class B bias, since this increases gain and therefore lowers the required drive signal amplitude. As the output level increases, this effect gets relatively less important, and the class B bias point is crossed at some point. In the region above this point, deeper and deeper class C bias is preferably used. At some point in this class C biased region, the driver amplitude will not be able to maintain the desired output level, so the bias must again increase with output amplitude. This constitutes a hard boundary on the allowed gate bias signal in a broad output level region, up to just below maximum output, where the bias preferably should rise faster, to allow for more output power. The hard boundary, if used directly together with the optimal curve at low levels to produce the bias signal, causes a sharp corner in the bias signal. This corner is a high-order nonlinearity which expands the spectrum of the bias signal. By using a seed signal that has the optimal behaviour for the bias signal at low levels (and the highest), and using the hard boundary in a non-linear filter according to the present invention, a system with near optimal performance regarding the limitations at hand, and that stays within set bandwidth restrictions, can be obtained.

A dynamic gate bias signal 95 is in this way generated by non-linear filtering. The non-linear filtering is dependent on at least the envelope signal. There is a distinct analogy with the dynamic drain bias embodiments described further above.

Figure 8:
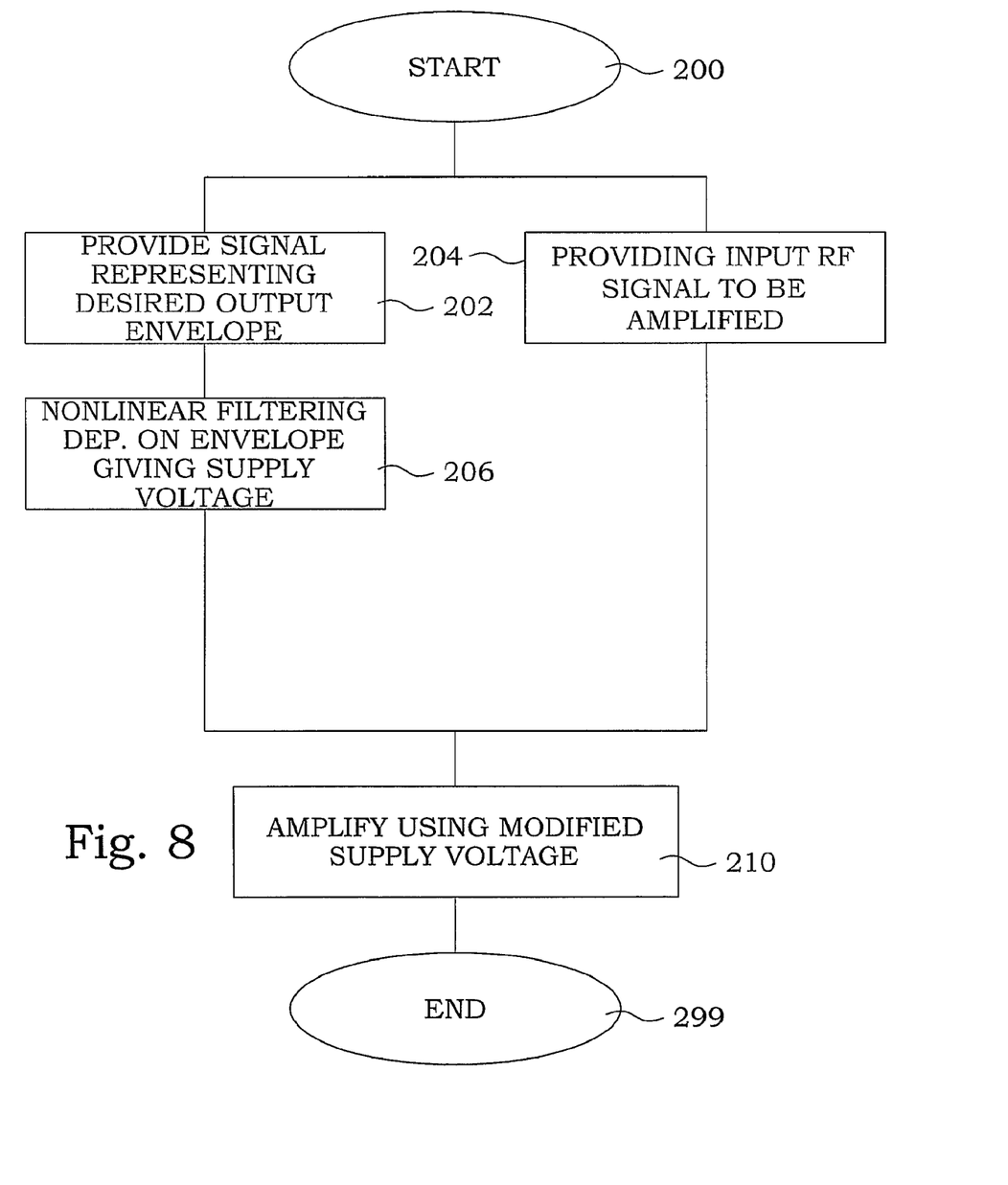
FIG. 8 is a flow diagram illustrating main steps of an embodiment of a method according to the present invention.

FIG. 8 illustrates the main steps of an embodiment of a method according to the present invention. The process starts in step 200. In step 202, a signal representing an envelope signal of the desired RF output signal is provided. In step 206, non-linear filtering is used to generate a supply voltage. The non-linear filtering is dependent on the signal representing the envelope signal. In step 204, an input RF signal to be amplified is provided. In step 210, the input RF signal is amplified using the supply voltage provided in step 206. The process ends in step 299.

In the present description of embodiments above, the amplifying device is exemplified by a Field Effect Transistor, FET, in which the terminals are denoted Drain, Gate and Source. The present invention can be applied to many other types of devices as well, such as Bipolar Junction Transistors (BJT), in which the terminals are denoted Collector, Base and Emitter, and Valves (Tubes), in which the terminals are denoted Plate, Grid and Cathode.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A method for generating a modulated output radio frequency (RF) signal, comprising the steps of:
   providing a signal representing an envelope signal of the desired RF output signal;
   generating a bias signal by non-linear filtering, the nonlinear filtering being dependent on the signal representing an envelope signal and performed in a cascade of stages, wherein in at least one stage of the cascade of stages comprises:
      extracting a difference between a minimum allowed voltage and a stage input signal,
      rectifying the difference for extracting undershoots in signal,
      filtering the rectified difference signal and combining the filtered signal and the stage input signal into a stage output signal, whereby the stage output signal is provided to a subsequent stage as stage input signal;
   providing an input RF signal to be amplified; and
   amplifying the input RF signal into the output RF signal using the bias signal.

2. The method according to claim 1, wherein the step of generating a bias signal comprises non-linear filtering using a boundary being dependent on the signal representing an envelope signal.

3. The method according to claim 1, wherein the boundary comprises a minimum allowed bias signal for each magnitude of a momentary value of the signal representing an envelope signal.

4. The method according to claim 1, wherein the bias signal is a gate bias signal.

5. The method according to claim 1, wherein the bias signal is a supply voltage.

6. The method according to claim 5, wherein the step of generating a supply-voltage comprises using the signal representing an envelope signal as input signal for the non-linear filtering.

7. The method according to claim 5, wherein the non-linear filtering is a slew-rate compensation.

8. The method according to claim 5, wherein the step of generating a supply voltage comprises amplification of an output signal from the non-linear filtering.

9. The method according to claim 5, comprising the further step of: receiving an original modulated signal; the desired output RF signal being an amplified version of the original modulated signal.

10. The method according to claim 9, wherein the step of providing a signal representing an envelope signal in turn comprises the step of extracting the envelope of the original modulated signal.

11. The method according to claim 9, wherein the step of providing an input RF signal to be amplified in turn comprises a step of modifying the original modulated signal.

12. The method according to claim 11, wherein the step of modifying the original modulated signal comprises a step of dynamically adjusting a phase-modulated carrier signal extracted from the original modulated signal.

13. The method according to claim 12, wherein the step of dynamically adjusting is performed according to variations of the dynamics of the supply voltage.

14. The method according to claim 13, wherein the step of dynamically adjusting is performed according to an output from the nonlinear filtering and on an expected response of the amplification of the output signal from the non-linear filtering.

15. The method according to claim 1, wherein the steps of claim 1 are performed in at least two stage of the cascade of stages, and wherein the step of combining comprises combining of the filtered signal and the stage input signal using a reinsertion factor $(k_1-k_n)$, the reinsertion factor $(k_2-k_n)$ for at least one stage being larger than the reinsertion factor $(k_1-k_{n-1})$ for a previous stage.

16. The method according to claim 1, comprising: the further step of generating a seed signal as a stage input signal for a first stage, the seed signal being a filtered function of the signal representing an envelope signal.

17. An arrangement for generating a modulated output radio frequency (RF) signal, comprising:
   means for providing a signal representing an envelope signal of the desired output RF signal;
   bias signal generator in turn comprising a non-linear filter being arranged to depend on the signal representing the envelope signal, wherein the non-linear filter comprises a cascade of stages and at least one stage of the cascade of stages comprises:
      means for extracting a difference between a minimum allowed supply voltage and a stage input signal;
      a rectifier connected to an output of the means for extracting, extracting undershoots in signal;
      a filter connected to an output of the rectifier; and
      a combiner connected to an output of the filter and to a signal representing the stage input signal, whereby an output signal of the combiner constitutes a stage output signal, provided to a subsequent stage, if any, as stage input signal;
   means for providing an input RF signal to be amplified; and
   an RF amplifier connected by an RF input to the means for providing an input RF signal and by a bias signal input to the bias signal generator, the RF amplifier giving the output RF signal.

18. The arrangement according to claim 17, wherein the non-linear filter is arranged to apply a boundary depending on the signal representing the envelope signal.

19. The arrangement according to claim 17, wherein the boundary comprises a minimum allowed bias signal for each magnitude of a momentary value of the signal representing the envelope signal.

20. The arrangement according to claim 17, wherein the bias signal generator is a gate bias generator connected to a gate of the RF amplifier.

21. The arrangement according to claim 17, wherein the bias signal generator is a supply voltage generator connected to a supply voltage input of the RF amplifier.

22. The arrangement according to claim 21, wherein the signal representing the envelope signal is connected to a signal input of the nonlinear filter.

23. The arrangement according to claim 21, wherein the non-linear filter is a slew-rate compensator.

24. The arrangement according to claim 21, wherein the supply voltage generator comprises an amplifier connected to an output of the non-linear filter.

25. The arrangement according to claim 21, further comprising:
receiver for an original modulated signal;
the desired output RF signal being an amplified version of the original modulated signal.

26. The arrangement according to claim 25, wherein the means for providing a signal representing an envelope signal comprises an envelope detector connected to the receiver.

27. The arrangement according to claim 25, wherein the means for providing an input RF signal comprises a signal modifier connected to a signal representing the original modulated signal.

28. The arrangement according to claim 27, wherein the signal modifier comprises means for dynamically adjusting a phase-modulated carrier signal extracted from the original modulated signal.

29. The arrangement according to claim 28, wherein the means for dynamically adjusting is connected to a signal representing variations of dynamics of the supply voltage.

30. The arrangement according to claim 29, wherein the means for dynamically adjusting is connected to an output of the non-linear filter and is arranged to compensate for expected response of the amplifier of the supply voltage generator.

31. The arrangement according to claim 17, comprising: and wherein the combiner is arranged to combine the filtered signal and the stage input signal using a reinsertion factor $(k_1-k_n)$, the reinsertion factor $(k_2-k_n)$ for at least one stage being larger than the reinsertion factor $(k_1-k_{n-1})$ for a previous stage.

32. The arrangement according to claim 17, comprising: wherein the supply voltage generator further comprises a generator of a seed signal as a stage input signal for a first stage, the seed signal being a filtered function of the signal representing the envelope signal.

* * * * *